(12) United States Patent
Sokel et al.

(10) Patent No.: US 8,063,402 B2
(45) Date of Patent: Nov. 22, 2011

(54) INTEGRATED CIRCUIT HAVING A FILLER STANDARD CELL

(75) Inventors: Ralph J. Sokel, Austin, TX (US); Glenn O. Workman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 250 days.

(21) Appl. No.: 12/422,765

(22) Filed: Apr. 13, 2009

(65) Prior Publication Data

US 2010/0258798 A1  Oct. 14, 2010

(51) Int. Cl.
*H01L 23/58* (2006.01)
(52) U.S. Cl. .............. 257/48; 257/E27.001; 438/18
(58) Field of Classification Search .............. 257/48, 257/E27.001; 438/18; 324/158; 716/8
See application file for complete search history.

(56) References Cited

U.S. PATENT DOCUMENTS

| 2004/0133868 A1* | 7/2004 | Ichimiya .................... 716/10 |
| 2006/0190790 A1 | 8/2006 | Pilling et al. |
| 2009/0189195 A1* | 7/2009 | Schroeder et al. ............ 257/203 |

* cited by examiner

*Primary Examiner* — Bradley K Smith
*Assistant Examiner* — Jami M Valentine
(74) *Attorney, Agent, or Firm* — Charles Bergere

(57) ABSTRACT

An integrated circuit includes a functional block having a plurality of standard cells. The plurality of standard cells includes a plurality of functional standard cells and a filler standard cell. Each functional standard cell of the plurality of functional standard cells has a rectangular boundary. The filler standard cell has a rectangular boundary adjacent to at least one of the functional standard cells. The filler standard cell is selectable between a first state and a second state. The filler standard cell is non-functional in the first state. The filler standard cell has functional test structures coupled to a first metal layer in the second state. This allows for test structures helpful in analyzing functionality of circuit features such as transistors without requiring additional space on the integrated circuit.

14 Claims, 4 Drawing Sheets

INTEGRATED CIRCUIT HAVING A FILLER STANDARD CELL

BACKGROUND

1. Field

This disclosure relates generally to forming an integrated circuit and more specifically, to forming filler standard cells in an integrated circuit.

2. Related Art

As customers demand more functionality on integrated circuits, the complexity of the integrated circuit increases. In addition, the time to market for these complex integrated circuits is decreasing. In the past, semiconductor manufacturers would manufacture test wafers having test devices to determine and fix problems, such as yield, before production wafers were manufactured. However, shorter time to market cycles do not allow for such testing. Instead, semiconductor manufacturers place test devices in the streets, which are the spaces between die, on the production wafers themselves, greatly limiting the number of structures available for characterization.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Test devices can be formed in the streets on production wafers because they are not needed for the functioning of the integrated circuit and hence their destruction or removal during die singulation does not impact the integrated circuit. (An integrated circuit may also be referred to as a semiconductor device.) In other words, test devices can be formed in the area between die on wafers. However, the area of the street limits the number of test devices that can be formed in the streets. Test devices can be formed, instead or in addition to those in the streets, in standard blocks (e.g., filler standard cells) within die. In one embodiment, filler standard cells can be modified to include test devices. Filler standard cells are blocks that are added to the wafer to fill empty space so that there is a consistent density across the wafer. Among other things, this consistent density may be useful for chemical mechanical polishing uniformity. In addition, filler standard cells may be added so that power and ground signals are coupled to other functioning cells. In one embodiment, a filler standard cell includes a latent device and in another embodiment the filler standard cell includes an active device or functional test device. The functional test device can be used to collect statistical characterization data of the process. Because a large number of filler standard cells are often present on the semiconductor wafer, the functional test structures are particularly useful in assessing process variability, such as intra-die variability.

Figure 1:
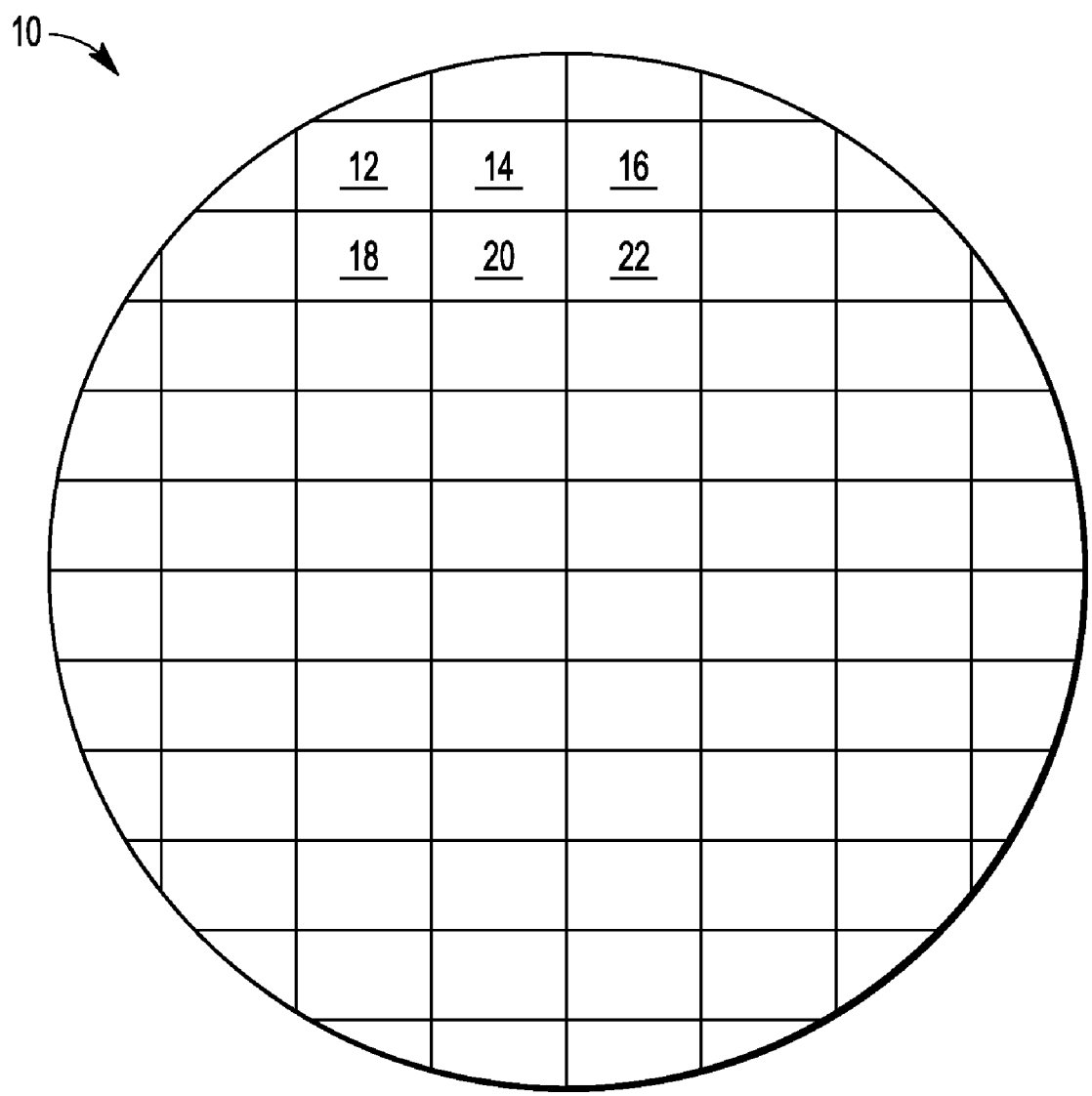
FIG. 1 illustrates a top-down view of a semiconductor wafer in accordance with an embodiment.

FIG. 1 illustrates a top-down view of semiconductor wafer 10 having multiple die, of which dies 12, 14, 16, 18, 20 and 22 are exemplary die. The semiconductor wafer 10 may be any size semiconductor wafer, such as a 200 mm or 300 mm semiconductor wafer. The semiconductor wafer 10 may be a wafer of any suitable semiconductor material, such as monocrystalline silicon.

Figure 2:
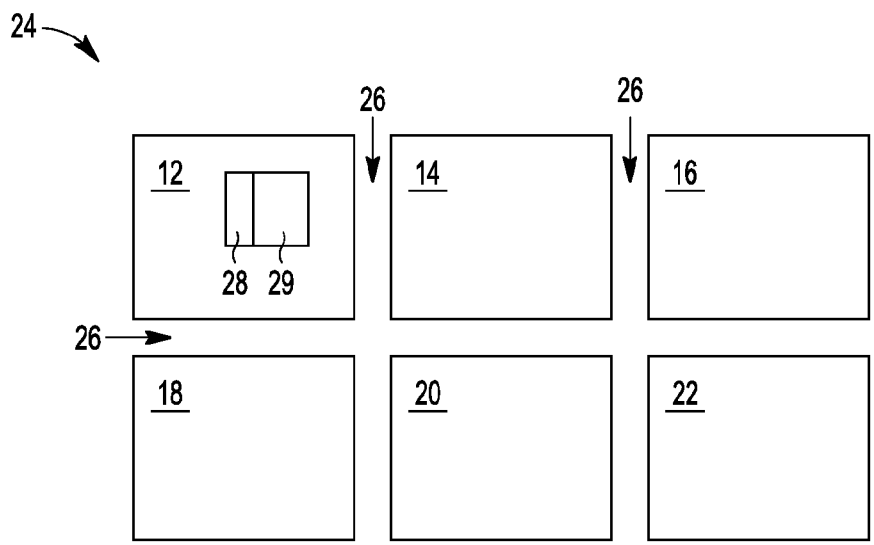
FIG. 2 illustrates various dies on the semiconductor wafer of FIG. 1 in accordance with an embodiment.

FIG. 2 illustrates the exemplary die 12, 14, 16, 18, 20, and 22 that in one embodiment may be formed using one reticle and hence form a reticle area 24. The reticle may be stepped across the semiconductor wafer 10 using a stepper tool, as is used in semiconductor manufacturing. Between the dies 12, 14, 16, 18, 20 and 22 are streets 26. The semiconductor wafer 10 will be singulated along the streets 26 to separate the dies 12, 14, 16, 18, 20 and 22. The die 12 includes functional blocks 28-29, which in one embodiment are logic blocks and hence, perform a logic function. In another embodiment, the functional blocks 28-29 perform an analog function. The other die (e.g., 14, 16, 18, 20 and 22) may also include the same functional blocks, although not illustrated. The functional blocks 28 and 29 may be any suitable functional blocks and have any suitable shape. In one embodiment, the functional blocks 28 and 29 are rectangular in shape. For example, functional block 29 has the same length as logic block 28 but varies in width.

Figure 3:
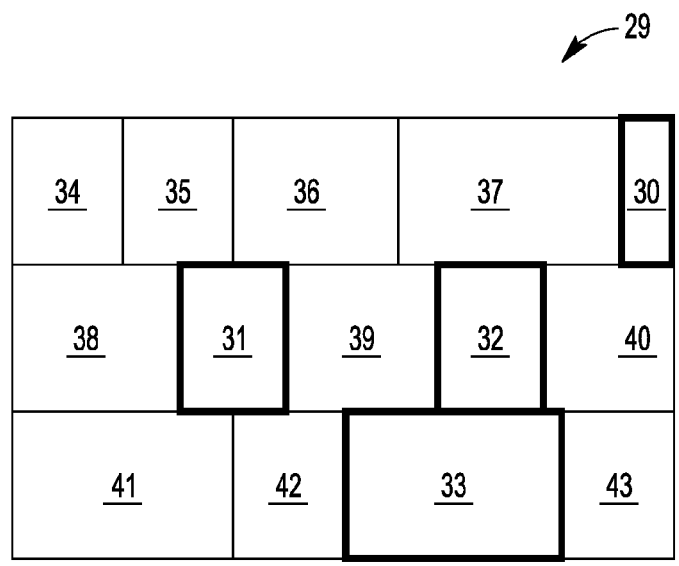
FIG. 3 illustrates a functional block in accordance with an embodiment.

FIG. 3 illustrates more details of the functional block 29 in accordance with an embodiment. In the embodiment illustrated, the functional block 29 includes standard cells 30-43, which includes both filler standard cells 30-33 and functional standard cells 34-43. In one embodiment, the standard cells 30-43 are rectangular in shape and hence, have rectangular boundaries. The functional standard cells 34-43 can be any suitable functional standard cell, such as an exclusive-or cell, an AND cell, a MUX, a NOR cell, the like, and combinations of the above. The filler standard cells 30-33 include either a first state or a second state, as will be better understood after further discussion.

Figure 4:
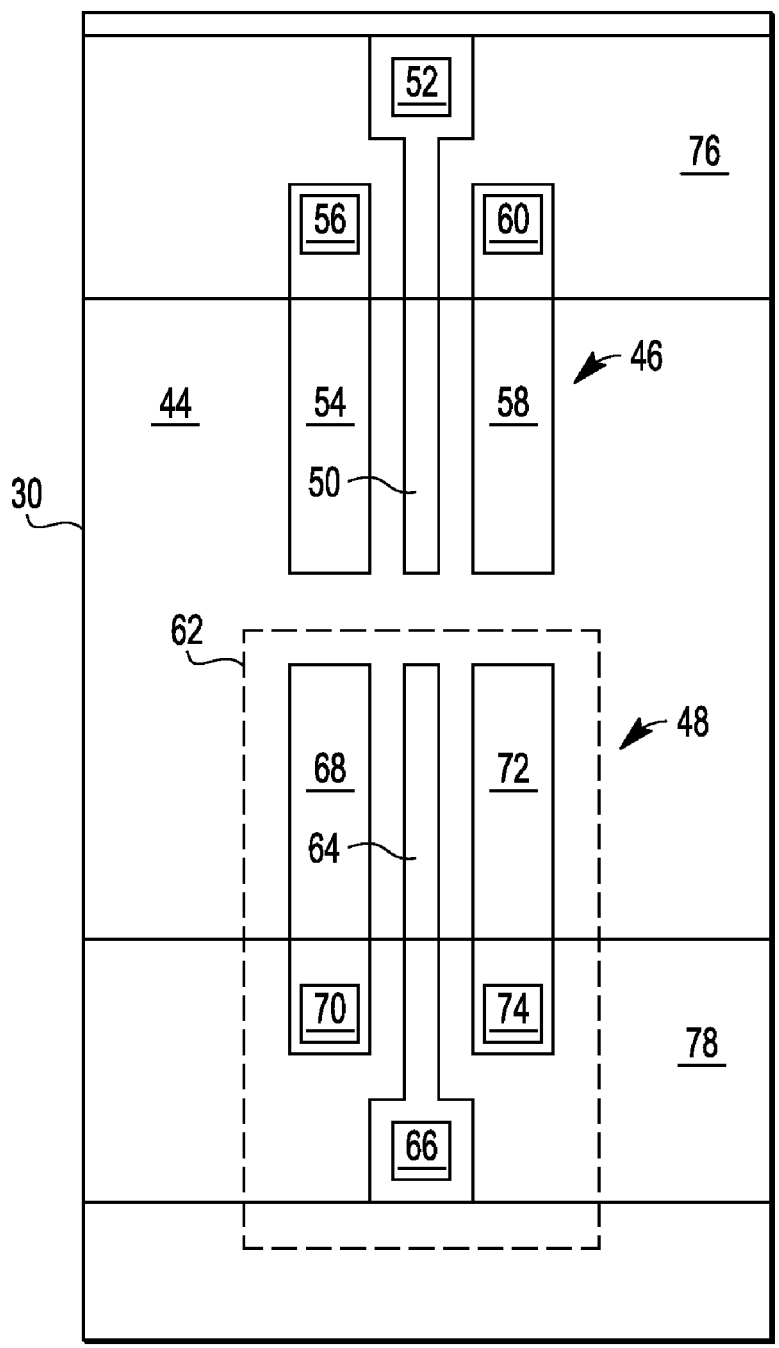
FIG. 4 illustrates a first state of a filler standard cell in accordance with an embodiment.

FIG. 4 illustrates the filler standard cell 30 in a first state 44 in accordance with an embodiment. The first state 44 of the filler standard cell 30 includes latent devices 46 and 48. The latent device 46 includes a dummy gate 50, which in one embodiment includes polysilicon, having a contact 52, and diffusion regions 54 and 58 having contacts 56 and 60, respectively. The latent device 48 is formed in an n-well 62 and includes a dummy gate 64, which in one embodiment includes polysilicon, having a contact 66, and diffusion regions 68 and 72 having contacts 70 and 74, respectively. The first state 44 of the filler standard cell 30 includes metal lines 76 and 78, which in one embodiment includes copper. The metal line 78 is coupled to power and other standard cells and the metal line 76 is coupled to ground. Thus, the metal line 78 may be a power line and the metal line 76 may be a ground line. In one embodiment, both the power line and the ground line cross the filler standard cell 30 in a first direction. Latent devices 46 and 48 are not active or functioning devices. In one embodiment, the latent devices 46 and 48 are dummy features that each include a polysilicon dummy gate and an active region spaced away from the dummy gate on a first side of the dummy gate and another active region spaced away from the dummy gate on a second side of the dummy gate. In other embodiments, the diffusion regions 54, 58, 68 and 72 and the dummy gates 50 and 64 layouts or designs can be altered. For example, diffusion regions 54 and 58 may be combined into one diffusion region and diffusion regions 68 and 72 may be combined into another diffusion region. The first state 44 of the filler standard cell 30 is used in the design to maintain density across the semiconductor wafer 10 without impacting the function of surrounding logic standard cells, but can not be used for testing electrical characteristics of the latent device in the filler standard cell 30. In one embodiment, the metal lines 76 and 78 are part of the first metal layer of the semiconductor manufacturing process. In other words, the metal lines 76 and 78 are at what is termed the "metal one" layer of the semiconductor manufacturing process.

Figure 5:
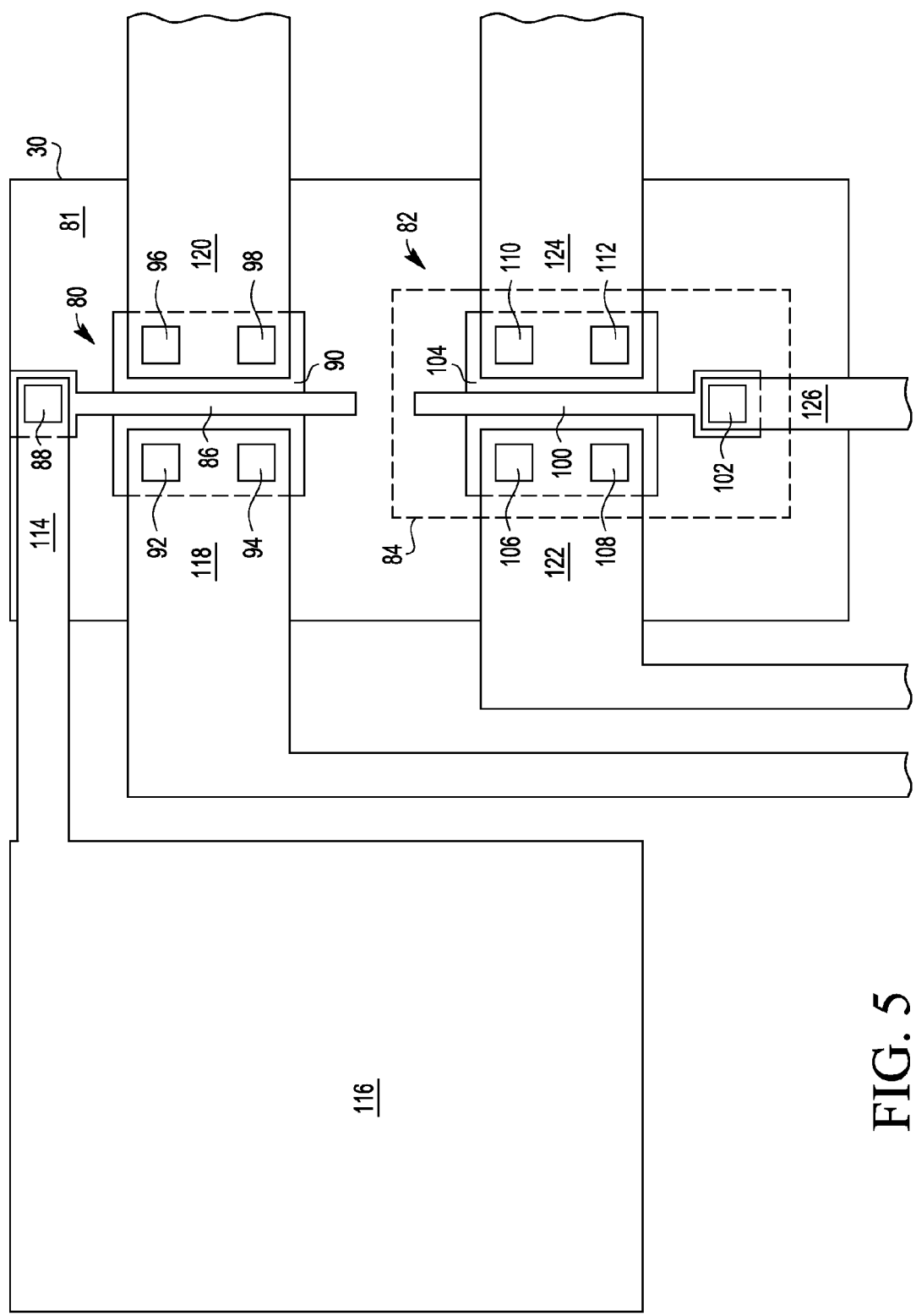
FIG. 5 illustrates a second state of the filler standard cell and a contact pad in accordance with an embodiment.

FIG. 5 illustrates the filler standard cell 30 in a second state 81 and a contact pad 116 in accordance with an embodiment. The second state 81 of the filler standard cell 30 includes functional test devices or functional test structures 80 and 82. The functional test device 80 is an n-channel transistor and the functional test device 82 is a p-channel transistor. The functional test devices 80 and 82 are modified versions of the latent devices 46 and 48 so that the functional test devices 80 and 82 can be used for testing electrical characteristics of the die 12. Hence, the functional test devices 80 and 82 are active or functional devices.

The n-channel functional test device 80 includes the gate line 86, which may include polysilicon and the diffusion region 90, which forms the source/drain regions for the device 80. The gate line 86 is coupled to contact 88, which is coupled to a metal line 114 and the contact pad 116. The contact pad 116 may be any size and in one embodiment, is larger than the filler standard cell 30 so that it can easily be probed. The contact pad 116 lies over another area of the die 12 and may be spaced away from the filler standard cell 30. (The contact pad may also be referred to as a probe pad.) In one embodiment, the contact pad 116 is in the same metal layer as the metal line 114. The diffusion region 90 includes first electrode region (e.g., source or drain region) contacts 92 and 94, which are coupled to a metal line 118. The metal line 118 is coupled to a contact pad that is not shown and may be located in the die 12. The diffusion region 90 also includes second electrode region (e.g., drain or source region) contacts 96 and 98, which are coupled to a metal line 120. The metal line 120 is coupled to a contact pad that is not shown and may be located in the die 12.

The p-channel functional test device 82 is formed in the n-well 84 and includes the gate line 100, which may include polysilicon and the diffusion region 104, which forms the source/drain regions for the device 82. The gate line 100 is coupled to contact 102, which is coupled to a metal line 126. The metal line 126 is coupled to a contact pad that is not shown and may be located in the die 12. The diffusion region 104 includes first electrode region (e.g., source or drain region) contacts 106 and 108, which are coupled to a metal line 122. The metal line 122 is coupled to a contact pad that is not shown and may be located in the die 12. The diffusion region 104 also includes second electrode region (e.g., drain or source region) contacts 110 and 112, which are coupled to a metal line 124. The metal line 124 is coupled to a contact pad that is not shown and may be located in the die 12.

In a preferred embodiment, the contact pads (116 and those not illustrated but discussed above) and the metal lines 114, 118, 120, 122, 124 and 126 are formed within the same layer, which in one embodiment is the first metal layer during a semiconductor manufacturing process. Hence, in one embodiment, the first metal layer has a first configuration for the first state and a second configuration different from the first configuration for the second state. This enables the same mask to be used and decreases complexity and cost of manufacturing the second state 81 of the filler standard cell 30. The second state 81 is manufactured when characterization data is desired. The second state 81 is a modification of the first state 44 (or vice versa). The second state 81 differs from the first state 44 by having a different metal layout, active layout and contact layout so that the latent devices become functional test devices, contact pads are added, and the devices are coupled to the contact pads to enable testing. (The testing can be any standard parametric test program.) Hence, the integrated circuit may have a first contact pattern for the first state and a second contact pattern different form the first contact pattern for the second state. Portions may be added or subtracted to the layout for each layer. These changes can be made by using different masks for the metal layout, active layout, and contact layout. However, as discussed above, the active layout of the first state 44 can be the same as that illustrated in the second states 81. Hence, a different mask may not be needed for the active layout. In general, at least one mask change (e.g., the metal layout) is needed to manufacture the first state 44 versus the second state 81. In one embodiment, the features that need to be added can be formed on a special layer that is not used in normal mask preparation. The mask used to form the second state would be created by subtracting the remove layer from the normal drawing layer using, for example, a Boolean AND NOT operation. In another embodiment, a separate mask or masks can be used.

The filler standard cell 30 (as well as other filler standard cells, such as those illustrated in FIG. 3 (cells 31-33) is selectable between the first state and the second state. Hence, one or more of the filler standard cells 31-33 may have a first state in which it is non-functional and a second state in which it is connected by a first metal layer in a manner different from that in which the first metal layer is connected in the first state. When the filler standard cell 30 is in the first state 44, the latent devices 46 and 48 are present and hence the filler standard cell is non-functional. When the filler standard cell 30 is in the second state 81, the functional test devices 80 and 82 are formed and the filler standard cell 30 is used to obtain characterization data. Thus, in the first state the filler standard cell 30 functions as a non-functioning standard cell, but in the second state the filler standard cell 30 functions to provide statistical characterization data that can be used to improve the manufacturing process, design, or both.

Hence, one can determine during design whether a filler standard cell includes the first state or the second state. Hence, in one embodiment, a method of making an integrated circuit includes designing a functional block comprising a plurality of standard cells; wherein the plurality of standard cells are designed to comprise a plurality of functional standard cells and a filler standard cell; each functional standard cell of the plurality of functional standard cells is designed to have a rectangular boundary; the filler standard cell is designed to have a rectangular boundary; the filler standard cell is designed to be selectable between a first state and a second state; the filler standard cell is designed to be non-functional in the first state; and the filler standard cell is designed to have functional test structures coupled to a first metal layer in the second state; selecting between the first state and the second state as the selected state; and manufacturing the integrated circuit with the selected state. In one embodiment, the step of selecting comprises selecting between a first pattern and a second pattern for a first metal layer. In another embodiment, the method may include all of the above and the step of selecting further comprises selecting between a first pattern of contacts and a second pattern of contacts. In one embodiment, the method includes all of the above and the step of selecting further comprises selecting between a first pattern of active regions and a second pattern of active regions. In one embodiment, the step of designing further comprises designing the filler standard cell to have inoperative features for the first state and operative features for the second state. In one embodiment, the step of designing further comprises designing the integrated circuit to have probe pads spaced away from the filler standard cell and connected to the filler standard cell through a line of the first metal layer.

By now it should be appreciated that there has been provided a cost-effective alternative to using a test mask to update models and characterize variability across a wafer. In addition, test devices can be added without the size restraints of the streets. Thus, the test devices in the filler standard cell can be used alone or in conjunction with test devices or structures formed in the streets.

Unless stated otherwise, terms such as "first" and "second" are used to arbitrarily distinguish between the elements such terms describe. Thus, these terms are not necessarily intended to indicate temporal or other prioritization of such elements. The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the polarities of the devices can be reversed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

What is claimed is:

1. An integrated circuit, comprising:
 a functional block comprising a plurality of standard cells, wherein:
  the plurality of standard cells comprise a plurality of functional standard cells and a filler standard cell;
  each functional standard cell of the plurality of functional standard cells have a rectangular boundary;
  the filler standard cell has a rectangular boundary adjacent to at least one of the plurality of functional standard cells;
  the filler standard cell is selectable between a first state and a second state;
  the filler standard cell is non-functional in the first state; and
  the filler standard cell has functional test structures coupled to a first metal layer in the second state; and
  a probe pad connected to the filler standard cell in the second state, wherein the probe pad is spaced from the filler standard cell in the second state.

2. The integrated circuit of claim 1, wherein the first metal layer has a first configuration for the first state and a second configuration different from the first configuration for the second state.

3. The integrated circuit of claim 1, wherein the functional test structures comprises a plurality of transistors.

4. The integrated circuit of claim 1, wherein the filler standard cell in the first state comprises a dummy feature, wherein the dummy feature comprises a polysilicon dummy gate.

5. The integrated circuit of claim 4, wherein the dummy feature further comprises a first active region spaced away from the polysilicon dummy gate on a first side of the polysilicon dummy gate and a second active region spaced away from the polysilicon dummy gate on a second side of the polysilicon dummy gate.

6. The integrated circuit of claim 1, wherein the filler standard cell in the first state has a ground metal line that crosses the filler standard cell in a first direction and a power metal line that crosses the filler standard cell in the first direction.

7. The integrated circuit of claim 1, wherein the functional block is for performing a logic function.

8. The integrated circuit of claim 1, wherein the functional block is for performing an analog function.

9. The integrated circuit of claim 1, wherein the functional block has a boundary that is rectangular.

10. The integrated circuit of claim 1, wherein the integrated circuit has a first contact pattern for the first state and a second contact pattern different from the first contact pattern for the second state.

11. The integrated circuit of claim 1, wherein the functional block further comprises a second filler standard cell having a first state in which the second filler standard cell is non-functional and a second state in which the second filler standard cell is connected by the first metal layer in a manner different from that in which the first metal layer is connected in the first state of the second filler standard cell.

12. An integrated circuit, comprising:
 a logic block having a plurality of logic standard cells and a filler standard cell, wherein:
  each of the plurality of logic standard cells is rectangular;
  the filler standard cell is rectangular and adjacent to at least one of the plurality of logic standard cells;
  the filler standard cell is programmable by a first metal layer;
  the first metal layer in a first configuration causes the filler standard cell to be in a first state and the first metal layer in a second configuration causes the filler standard cell to be in a second state;
  in the first state the filler standard cell is non-functional; and
  in the second state the filler standard cell has functional test transistors coupled to probe pads.

13. The integrated circuit of claim 12, wherein the probe pads are spaced away from the filler standard cell in the second state and the filler standard cell has a contact pattern in the second state that is different from a contact pattern in the first state.

14. An integrated circuit, comprising:

a functional block including a plurality of standard cells, wherein:

the plurality of standard cells comprise a plurality of functional standard cells having rectangular boundaries and a filler standard cell having a rectangular boundary adjacent to at least one of the plurality of functional standard cells;

the filler standard cell is selectable between a non-functional first state and a second state;

the filler standard cell has functional test structures coupled to a first metal layer in the second state;

the filler standard cell in the first state has a dummy feature that comprises a polysilicon dummy gate and a first active region spaced from the polysilicon dummy gate on a first side of the polysilicon dummy gate and a second active region spaced from the polysilicon dummy gate on a second side of the polysilicon dummy gate.

* * * * *